(12) United States Patent
Katayama et al.

(10) Patent No.: US 7,295,467 B2
(45) Date of Patent: Nov. 13, 2007

(54) SEMICONDUCTOR MEMORY HAVING ELECTRICALLY ERASABLE AND PROGRAMMABLE SEMICONDUCTOR MEMORY CELLS

(75) Inventors: Kunihiro Katayama, Chigasaki (JP); Takayuki Tamura, Yokohama (JP); Kiyoshi Inoue, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 277 days.

(21) Appl. No.: 11/206,995

(22) Filed: Aug. 19, 2005

(65) Prior Publication Data

US 2006/0062045 A1    Mar. 23, 2006

Related U.S. Application Data

(63) Continuation of application No. 11/043,114, filed on Jan. 27, 2005, now Pat. No. 7,002,847, which is a continuation of application No. 10/872,515, filed on Jun. 22, 2004, now Pat. No. 6,891,759, which is a continuation of application No. 10/685,441, filed on Oct. 16, 2003, now Pat. No. 6,771,542, which is a continuation of application No. 10/304,046, filed on Nov. 26, 2002, now Pat. No. 6,683,812, which is a continuation of application No. 09/944,406, filed on Sep. 4, 2001, now Pat. No. 6,493,273, which is a continuation of application No. 09/537,722, filed on Mar. 30, 2000, now Pat. No. 6,285,595, which is a continuation of application No. 09/085,173, filed on May 28, 1998, now Pat. No. 6,052,315.

(30) Foreign Application Priority Data

May 28, 1997   (JP) ................... 09-139019

(51) Int. Cl.
    *G11C 16/04* (2006.01)

(52) U.S. Cl. .................. 365/185.03; 376/185.29; 376/185.24
(58) Field of Classification Search ......... 365/185.24, 365/185.3, 185.03
    See application file for complete search history.

(56) References Cited

U.S. PATENT DOCUMENTS 5,018,107 A    5/1991   Yoshida (Continued)

FOREIGN PATENT DOCUMENTS

WO    0090124    10/1990

OTHER PUBLICATIONS

Bauer et al., "TA 7.7: A multi-level-cell 32Mb flash memory", ISSCC95/Feb. 16, 1995/Digest of Technical Papers: Session 7, INTEL.

*Primary Examiner*—Thong Q. Le
(74) *Attorney, Agent, or Firm*—Antonelli, Terry, Stout & Kraus, LLP.

(57) ABSTRACT

An electrically alterable non-volatile multi-level memory device and a method of operating such a device, which includes setting a status of at least one of the memory cells to one state selected from a plurality of states including at least first to fourth level states, in response to information to be stored in the one memory cell, and reading the status of the memory cell to determine whether the read out status corresponds to one of the first to fourth level states by utilizing a first reference level set between the second and third level states, a second reference level set between the first and second level states and a third reference level set between the third and fourth level states.

4 Claims, 4 Drawing Sheets

U.S. PATENT DOCUMENTS

| | | |
|---|---|---|
| 5,218,569 A | 6/1993 | Banks |
| 5,262,984 A | 11/1993 | Noguchi et al. |
| 5,272,667 A * | 12/1993 | Yamada et al. ............. 365/113 |
| 5,303,188 A | 4/1994 | Kohno |
| 5,771,194 A | 6/1998 | Maeno |
| 5,786,273 A * | 7/1998 | Hibi et al. .................. 438/637 |
| 5,896,318 A | 4/1999 | Asada et al. |
| 6,493,273 B2 | 12/2002 | Katayama et al. |

* cited by examiner

INFORMATION STORAGE DEVICE

SEMICONDUCTOR MEMORY HAVING ELECTRICALLY ERASABLE AND PROGRAMMABLE SEMICONDUCTOR MEMORY CELLS

CROSS-REFERENCE TO RELATED APPLICATIONS

This is a Continuation of application Ser. No. 11/043,114, filed Jan. 27, 2005, now U.S. Pat. No. 7,002,847 which is a Continuation of application Ser. No. 10/872,515, filed Jun. 22, 2004 (now U.S. Pat. No. 6,891,759), which is a Continuation of application Ser. No. 10/685,441, filed Oct. 16, 2003 (now U.S. Pat. No. 6,771,542), which is a Continuation of application Ser. No. 10/304,046, filed Nov. 26, 2002 (now U.S. Pat. No. 6,683,812, which is a Continuation of application Ser. No. 09/944,406, filed Sep. 4, 2001 (now U.S. Pat. No. 6,493,273); which is a Continuation of application Ser. No. 09/537,722, filed Mar. 30, 2000 (now U.S. Pat. No. 6,285,595); which is a Continuation of application Ser. No. 09/085,173, filed May 28, 1998 (now U.S. Pat. No. 6,052,315), the entire disclosures of which are hereby incorporated by reference.

BACKGROUND OF THE INVENTION

The present invention relates to semiconductor memories having electrically erasable and programmable nonvolatile semiconductor memory cells. More specifically, the present invention is directed not only to a semiconductor memory for recording a plurality of pieces of bit data on a cell basis by setting one of four or more potential levels to each cell but also to an information storage device capable of including a semiconductor memory.

Keeping pace with the development of portable information devices, storage devices using a writable nonvolatile memory as a storage medium are rapidly gaining popularity in recent years.

However, the cost-per-unit-capacity of a storage device using a nonvolatile memory as a storage medium is higher than that of a storage device using a magnetic disk as a storage medium. Therefore, equipment requiring a large storage capacity often employs storage devices using a magnetic disk as a storage medium.

Under these circumstances, there has been a demand for an increased storage capacity in developing nonvolatile-memory-based storage devices.

Multilevel memory technology is a solution to meet this demand.

The multilevel memory technology involves a control over a potential of a floating gate provided in an electrically erasable and programmable nonvolatile semiconductor memory cell so that the potential belongs to one of a plurality of predetermined potential levels.

This technology also identifies a potential stored in a cell by checking which potential level such potential belongs to. Through these operations, a single cell is allowed to deal with multilevel data.

The aforementioned technology thus opens the way to the recording of data consisting of a plurality of bits in a cell unlike conventional technologies that allow only one-bit data to be recorded in a cell. As a result, large-capacity storage can be implemented.

In the multilevel memory technology, the operation of writing data to a cell is performed with considerations given to provide a margin between a desired potential level and a potential level adjacent to the desired potential level by controlling the setting of a potential to a floating gate more finely.

With respect to the reading of data written in a cell, techniques are disclosed in ISSCC95/Feb. 16, 1995/Digest of Technical Papers: Session 7 "Flash Memory" TA 7.7 (pp. 132 to 133): A multilevel-Cell 32 Mb Flash Memory (INTEL Corporation), and JP-A-4-507320.

In the former technique, the potential level stored in a cell is identified from a plurality of predetermined potential levels through the operation of discriminating the potential stored in the cell (the operation of discriminating one of two levels) performed for a plurality of times. As a result of these operations, data consisting of a plurality of bits written in the cell is determined.

Let us take an example in which two-bit data is written to a single cell by setting the potential to be stored in the cell to one of four levels.

In this example, the four levels are grouped into two. A discriminating operation is performed to determine which group the potential stored in the cell belongs to.

Then, the group to which the potential stored in the cell belongs determined from the result of the discriminating operation is further divided into two subgroups, and another discriminating operation is performed to determine which subgroup the potential stored in the cell belongs to.

As a result of these operations, the level to which the potential stored in the cell belongs is identified from the predetermined four levels. Thus, the two-bit data written to the cell is determined.

On the other hand, in the latter technique, the level to which the potential stored in a cell belongs is identified from a plurality of predetermined levels using a plurality of discriminating means whose discriminating thresholds are different. Through this technique, data consisting of a plurality of bits written to the cell can be determined.

Let us take an example in which two-bit data is written to a single cell by setting the potential to be stored in the cell to one of four levels.

In this example, means for discriminating the first level and the second to fourth levels among the four levels are provided, and means for discriminating the first and second levels and the third and fourth levels are provided, and further means for discriminating the first to third levels and the fourth level are provided. By causing these discriminating means to perform their discriminating operations once, the level to which the potential stored in the cell belongs is identified from the four levels.

Through these operations, the two-bit data written to the cell is determined.

By the way, the read operation involved in the aforementioned multilevel memory technology addresses the following problems.

In the technique in which the level to which the potential stored in a cell belongs is identified from a plurality of predetermined levels through the potential discriminating operation performed for a plurality of times, data consisting of a plurality of bits is determined through the plurality of discriminating operations, and thus the read operation takes time.

The seriousness of this problem increases with increasing number of bits constituting the data to be stored in a single cell. Thus, this problem impairs the high-speed reading performance that is one of the advantages a storage device using a nonvolatile memory as a storage medium has over a storage device using a magnetic disk as a storage medium.

In the technique in which the level to which the potential stored in a cell belongs is identified from a plurality of predetermined levels using a plurality of discriminating means whose discriminating thresholds are different, a plurality of discriminating means must be provided, and thus the area of the chip is disadvantageously increased.

The seriousness of this problem also increases with increasing number of bits constituting the data to be stored in a single cell. That is, if two-bit data is to be stored in a single cell, three discriminating means are required per cell, which means that, if three-bit data is to be stored in a single cell, seven discriminating means are required per cell.

Such disadvantage, which is the increased chip area brought about by the increased number of peripheral circuits, does spoil the advantage, which is the increased storage capacity per array area given by the increased number of bits per cell.

SUMMARY OF THE INVENTION

The present invention has been made in view of the aforementioned circumstances. The object of the present invention is, therefore, to provide a semiconductor memory and an information storage device both capable of achieving multilevel memory technology without impairing data reading performance nor increasing chip area.

To achieve the above object, the present invention is applied to a semiconductor memory having an electrically erasable and programmable nonvolatile semiconductor memory cell, and such semiconductor memory includes:

means for setting a potential to the cell, the potential corresponding to a level indicated by a bit data string obtained by arranging a plurality of pieces of bit data to be stored in the cell in a predetermined order; and means for discriminating or comparing the potential set to the cell by the potential setting means with a reference potential.

The discriminating means sequentially reads a plurality of pieces of one-bit data constituting the bit data string arranged in the predetermined order from a piece of one-bit data corresponding to a starting bit of the bit data string every time the discriminating means performs a discriminating operation with respect to the cell by setting the reference potential to a level, the level corresponding to a number of bits in the bit data string, a number of times of discriminating operations to be performed with respect to the cell and a result of the discriminating operation already performed with respect to the cell.

The discriminating means performs the discriminating operation, e.g., in the following procedure.

In a first discriminating operation with respect to the cell, the discriminating means discriminates the potential set to the cell by setting the reference potential to an intermediate level between a potential level corresponding to a minimum level possibly indicated by the bit data string when a value set to the starting bit of the bit data string is 1 and values set to other bits are unknown and a potential level corresponding to a maximum level possibly indicated by the bit data string when a value set to the starting bit-of the bit data string is 0 and values set to other bits are unknown.

As a result of this operation, the starting bit data is read.

In a second discriminating operation with respect to the cell and onwards, the discriminating means discriminates the potential set to the cell by setting the reference potential to an intermediate level between a potential level corresponding to a minimum level possibly indicated by the bit data string when values set from the starting bit to a so-far-read bit of the bit data string are the respective read values and a value set to a next to-be-read bit is 1 and values set to other bits are unknown and a potential level corresponding to a maximum level possibly indicated by the bit data string when values set from the starting bit to the so-far-read bit of the bit data string are the respective read values and a value set to the next to-be-read bit is 0 and values set to other bits are unknown.

As a result of these operations, the to-be-read bit data is read.

By repeating the aforementioned discriminating operations sequentially, the pieces of bit data from the second to the final bit of the bit data string obtained by arranging the plurality of pieces of bit data in the predetermined order are sequentially read.

According to the semiconductor memory of the present invention having such structure, a plurality of pieces of one-bit data stored in a cell can be read on a one-bit data basis every time the discriminating means performs the discriminating operation with respect to the cell.

Therefore, multilevel memory technology can be achieved without impairing data reading performance nor increasing chip area due to an increased number of discriminating means.

In the semiconductor memory of the present invention, data is recorded and reproduced on a data block basis, a data block consisting of a plurality of bits. Further, a plurality of cells are arranged in the semiconductor memory, each cell corresponding to the plurality of bits constituting the data block.

The potential setting means sets a potential to each of the plurality of cells, the potential corresponding to a level indicated by a bit data string obtained by arranging as many data blocks as a number of bits corresponding to the cell in a predetermined order.

A plurality of discriminating means are arranged, each discriminating means corresponding to each of the plurality of cells. The discriminating means may read a to-be-read data block from the plurality of cells by performing the operation of discriminating the potential of the corresponding cell for a number of times corresponding to a bit number from a first in the bit data string, the one-bit data constituting the to-be-read data block.

A file-based storage device usually records and reproduces data on a file basis, a file consisting of a plurality of sectors. That is, a plurality of sectors are recorded and read by a single access command operation. Further, the order in which the plurality of sectors are accessed is usually fixed.

When the semiconductor memory of the present invention is applied to a file-based storage device of the aforementioned type, each cell stores one bit from each of a plurality of sectors (data blocks) in a predetermined order. The potential to be set to each cell belongs to a level corresponding to a level indicated by a bit data string obtained by arranging a plurality of pieces of one-bit data respectively corresponding to the plurality of sectors in the order in which the plurality of sectors is accessed.

As a result of this arrangement, the sectors stored in a plurality of cells can be read in the order in which the sectors are accessed every time the discriminating means performs the discriminating operation.

That is, a piece of data can be retrieved from a sector without having to go through with all of the potential discriminating operation that is required to be performed for a plurality of times. Therefore, an access time similar to that required for a two-level memory can be achieved.

For example, a four-level memory cell can store two bits. A total of 4096 cells can store 1024 bytes, i.e., two sectors (one sector=512 bytes) in terms of the storage capacity of an ordinary hard disk drive (HDD).

Thus, the semiconductor memory of the present invention has 4096 cells, and the first to 4096th pieces of bit data in each of the two sectors are stored in the first to 4096th cells.

The potential of each cell is set to a level corresponding to a level indicated by a bit data string obtained by arranging two pieces of bit data to be stored in the cell in the order in which the two sectors are accessed.

As a result of this arrangement, the first discriminating operation performed by a discriminating means dedicated to each of the 4096 cells allows the previously accessed one of the two pieces of sector data to be retrieved, and the second discriminating operation allows the other, subsequently accessed one of the two pieces of sector data to be retrieved.

That is, the sector data can be read every time the discriminating means performs the discriminating operation, and thus an access time similar to that required for a two-level memory can be achieved.

DESCRIPTION OF THE PREFERRED EMBODIMENTS

An embodiment of the present invention will now be described.

The following presents an example in which four levels (two-bit data) are stored per cell.

Figure 1:
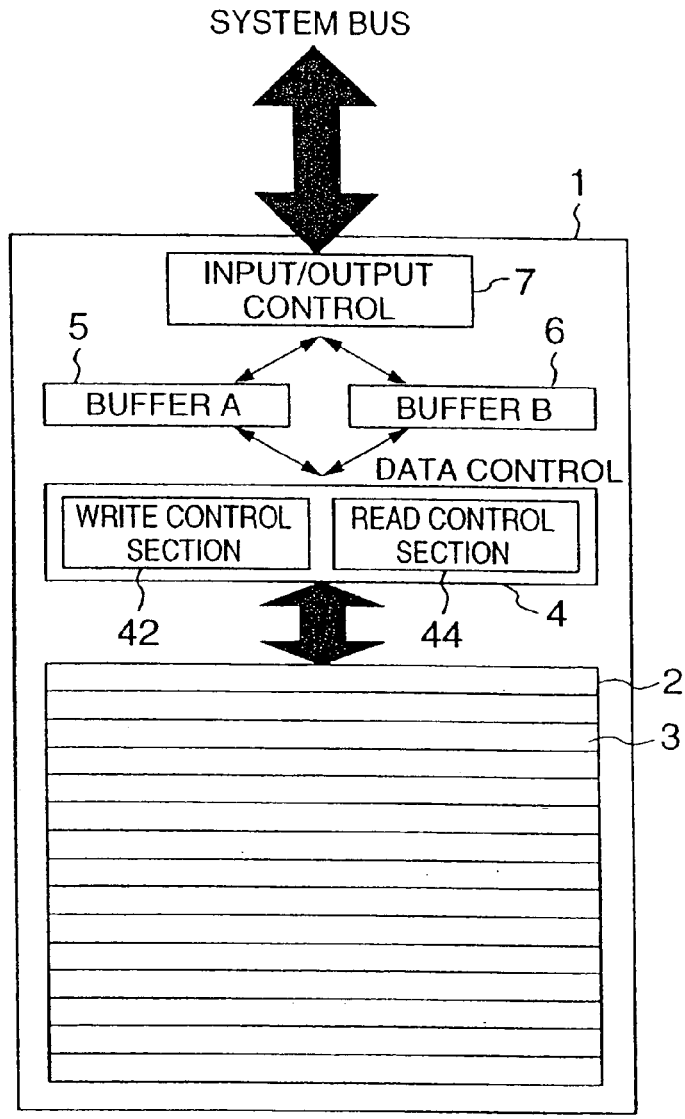
FIG. 1 is a schematic diagram showing an architecture of a memory chip which is an embodiment of the present invention and to which a multilevel memory technology is applied.

FIG. 1 is a schematic diagram showing an architecture of a memory chip which is an embodiment of the present invention and to which a multilevel memory technology is applied.

A memory chip 1, which is an embodiment of the present invention, comprises an electrically erasable and programmable read only memory (EEPROM) array 2, a data control circuit 4, a data block buffer 5A, a data block buffer 6B and an input/output (I/O) control circuit 7.

The EEPROM array 2 includes a plurality of electrically erasable and programmable nonvolatile semiconductor memory cells (hereinafter referred to as the "cell" whenever applicable).

A memory block 3 is a set of cells and provides a unit for erasing data from the EEPROM array 2.

In order to deal with data on the basis of a sector (one sector=512 bytes=4096 bits), which is a storage capacity unit generally applied to magnetic disk devices, a single memory block is designed to have 4096 memory cells in this embodiment.

As described above, this embodiment is designed to store four levels (two-bit data) per cell, which means that a single memory block can store 8192 bits.

The data block buffer A5 and the data block buffer B6 temporarily store data to be written to or read from the EEPROM array 2. Each buffer is designed to store 4096 bits in this embodiment.

The I/O control circuit 7 connects the memory chip 1 to a system bus of a storage device on which the chip 1 is mounted. The circuit 7 controls input and output of data by receiving addresses, command codes or control signals.

The memory chip 1 receives writing data from an external source on a sector basis. The I/O control circuit 7 stores the received data in the data block buffer A5 or B6. The circuit 7 selects a buffer to which the received data is written based on a sector address and on the written state of a memory block 3 specified by the sector address.

The I/O control circuit 7 further sends data read from a memory block 3 and stored in the data block buffer A5 or B6 to an external destination.

As shown in FIG. 1, the data control circuit 4 has a write control section 42 and a read control section 44.

The write control section 42 writes data stored in the data block buffers A5 and B6, respectively, to a corresponding memory block 3 of the EEPROM array 2.

Write operation is performed in the following procedure.

First, 4096-bit data stored in each of the data block buffers A5 and B6 is retrieved from each of the buffers A5 and B6, and the 4096 bits constituting such data are numbered on a bit basis. More specifically, the 4096 bits of data stored in each buffer A5 or B6 is sequentially numbered from the first bit to the final 4096th bit.

Then, a level indicated by a bit data string is calculated. The bit data string is obtained by arranging the data whose bits are numbered on a bit basis in the order of the data block buffer A5 and the data block buffer B6. Since the bit data string consists of two bits, four levels can possibly be indicated by the bit data string.

Then, each of the first to 4096th cells of a memory block 3 is electrically charged so that each cell is set to a potential corresponding to a level indicated by the bit data string whose bits are given a bit number corresponding to the cell.

The write operation will be described in more detail.

Figure 2:
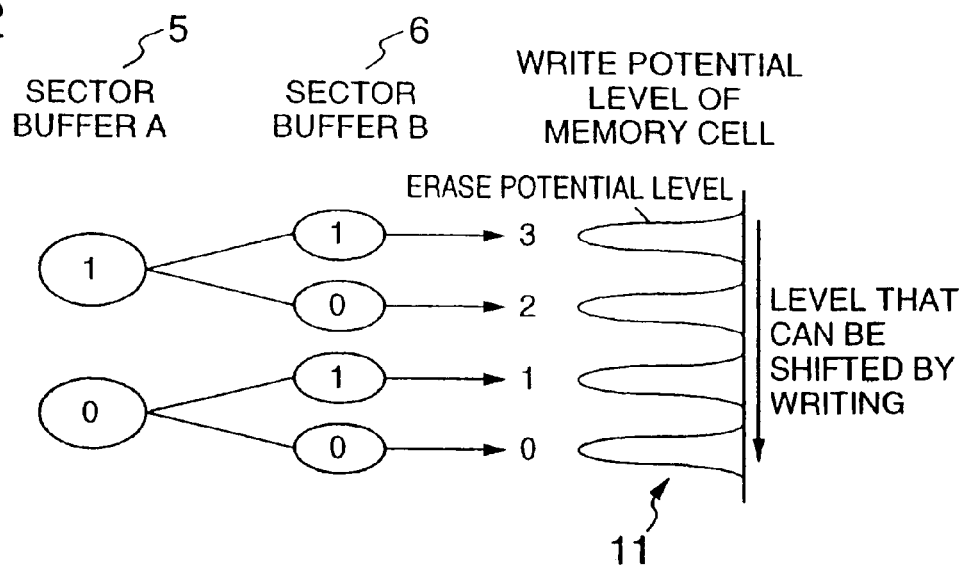
FIG. 2 is a diagram explaining a potential level for storing pieces of data which have a bit number and which are stored in data block buffers 5 and 6.

FIG. 2 is a diagram explaining a potential for writing pieces of data which have a bit number and which are stored in the data block buffers A5 and B6, respectively.

FIG. 2 presents how four levels each specifying a potential are determined from a piece of data (two levels) having a bit number stored in the data block buffer A5 and a piece of data. (two levels) having the same bit number stored in the data block buffer B6.

In FIG. 2, a portion 11 schematically depicts distributions of potential levels that can be set to the floating gate of a cell in the EEPROM array 2. The potential to be set to a cell is one of four levels corresponding to four possible values given by data to be written to the cell.

For example, if a piece of data in the data block buffer A5 is "1" and a piece of data in the data block buffer B6 is "0" with respect to a bit number, the level indicated by the bit data string is 2 when these pieces of data are arranged in the order of the data block buffer A5 and the data block buffer B6.

In this case, the potential to be set to a cell corresponding to the bit number is within the second potential range from the top in portion 11 of FIG. 2.

If, e.g., a piece of data in the data block buffer A5 is "0" and a piece of data in the data block buffer B6 is "1" with respect to a bit number, the level indicated by the bit data string is 1 when these pieces of data are arranged in the order of the data block buffer A5 and the data block buffer B6.

In this case, the potential to be set to a cell corresponding to the bit number is within the third potential range from the top in portion 11 of FIG. 2.

If only the data block buffer A5 has data and the data block buffer B6 has no data, the potential level is determined, assuming that data "1" is stored in each bit of the buffer B6. Therefore, the level indicated by the bit data string is either "3" or "1."

The potential setting procedure in this case is as follows. Upon storage of a piece of data in the data block buffer B6, such piece of data is retrieved from the buffer B6, and the retrieved piece of data and a corresponding piece of data already written to the data block buffer A5 are referred to, so that the potential is set.

For example, when a piece of data is stored in the data block buffer B6, the read control section 44, which will be described later, reads a piece of data already written to the data block buffer A5 to obtain the value of the data read from the buffer A5.

Then, the level indicated by the bit data string obtained by arranging pieces of data in the data block buffers A5 and B6 in the order of the data block buffer A5 and the data block buffer B6 is calculated for each bit number.

Successively, each of the cells in the memory block 3 is charged again to a potential level corresponding to the level indicated by the bit data string whose bit number corresponds to the cell.

Further, the values of data stored in the data block buffer B6 are checked for each bit number, for example.

It should be reminded here that for those cells corresponding to the bit numbers in which data "1" is stored in the data block buffer B6, the potential levels are set, during the operations of writing data stored in the data block buffer A5, by assuming that each bit of the data block buffer B6 contains data "1." For this reason, write operations are skipped for those cells.

On the other hand, the potential levels are set to those cells corresponding to the bit numbers in which data "0" is stored in the data block buffer B6 in such a manner that the potential levels are decreased by one order of magnitude (i.e., by a potential level necessary to move down to the next potential range as seen in portion 11 of FIG. 2).

To summarize, the potential control is effected as follows. The potential to be set to a cell corresponding to a bit number is equal to a level indicated by a bit data string that is obtained by arranging a piece of data having the bit number in the data block buffer A5 and a piece of data having the same bit number in the data block buffer B6 in the order of the data block buffer A5 and the data block buffer B6.

These steps are taken in consideration of the following characteristics of the EEPROM.

The EEPROM is in the highest potential state when erased, i.e., when the EEPROM is ready to be written with data of any level indicated by the bit data string. This "erase"-state corresponds to level "3" indicated by the bit data string.

On the other hand, the lowest level corresponds to level "0" indicated by the bit data string. The lowest level is brought about by charging electrons to the floating gate of a cell.

Further, the once decreased potential levels can be increased by erasing data collectively on a data block 3 basis.

It should be emphasized that the potential level can be decreased on a cell basis but that the potential level is increased on a data block basis through erase operation.

In other words, the EEPROM allows data to be written additionally in a small storage capacity unit by, e.g., overwriting. However, once the potential level is changed to a level from the erase state, the EEPROM does not allow potential levels higher than that level to be set unless data are erased on a data block basis.

To reduce this burden borne by the user, this embodiment is designed such that, when only the data block buffer A5 has data, each of the bits in the data block buffer B6 is assumed to contain data "1" so that either level "3" or "1" is indicated by the bit data string. That is, considerations are given to set the potential to a higher level in this embodiment.

Further, when a piece of data is thereafter written to the bit in the data block buffer B6 and the potential indicated by the bit data string is changed to level "2" or "0" as a result of such data writing, this embodiment allows a potential corresponding to the changed level "2" or "0" to be set to the cell corresponding to such bit.

Therefore, once a piece of data stored in the data block buffer A5 has been written, such piece of data stored in the buffer A5 cannot be rewritten unless data are erased on a data block basis.

However, it is no longer necessary to write a piece of data stored in the data block buffer B6 together with a corresponding piece of data stored in the data block buffer A5.

If data is stored only in the data block buffer B6 and no data is yet stored in the data block buffer A5, the potential level can be determined by assuming that each bit in the buffer A5 contains data "1." In this case, the level indicated by the bit data string corresponds to "3" or "2."

The potential setting procedure in this case is as follows. Upon storage of a piece of data in the data block buffer A5, such piece of data is retrieved from the buffer A5, and the retrieved piece of data and a corresponding piece of data already written to the data block buffer B6 are referred to, so that the potential is set.

These steps are also taken in consideration of the aforementioned characteristics of the EEPROM.

The potential of a cell can be set to a desired level by gradually adding up charges.

Further, the potential of a cell may also be set to a desired level by first storing charges to a level one order of magnitude lower than the desired level at a stretch and then gradually adding up charges to the desired level. This technique permits quick data writing to the cell.

The read control section 44 controls the reading of data from a memory block 3 of the EEPROM array 2.

Figure 3:
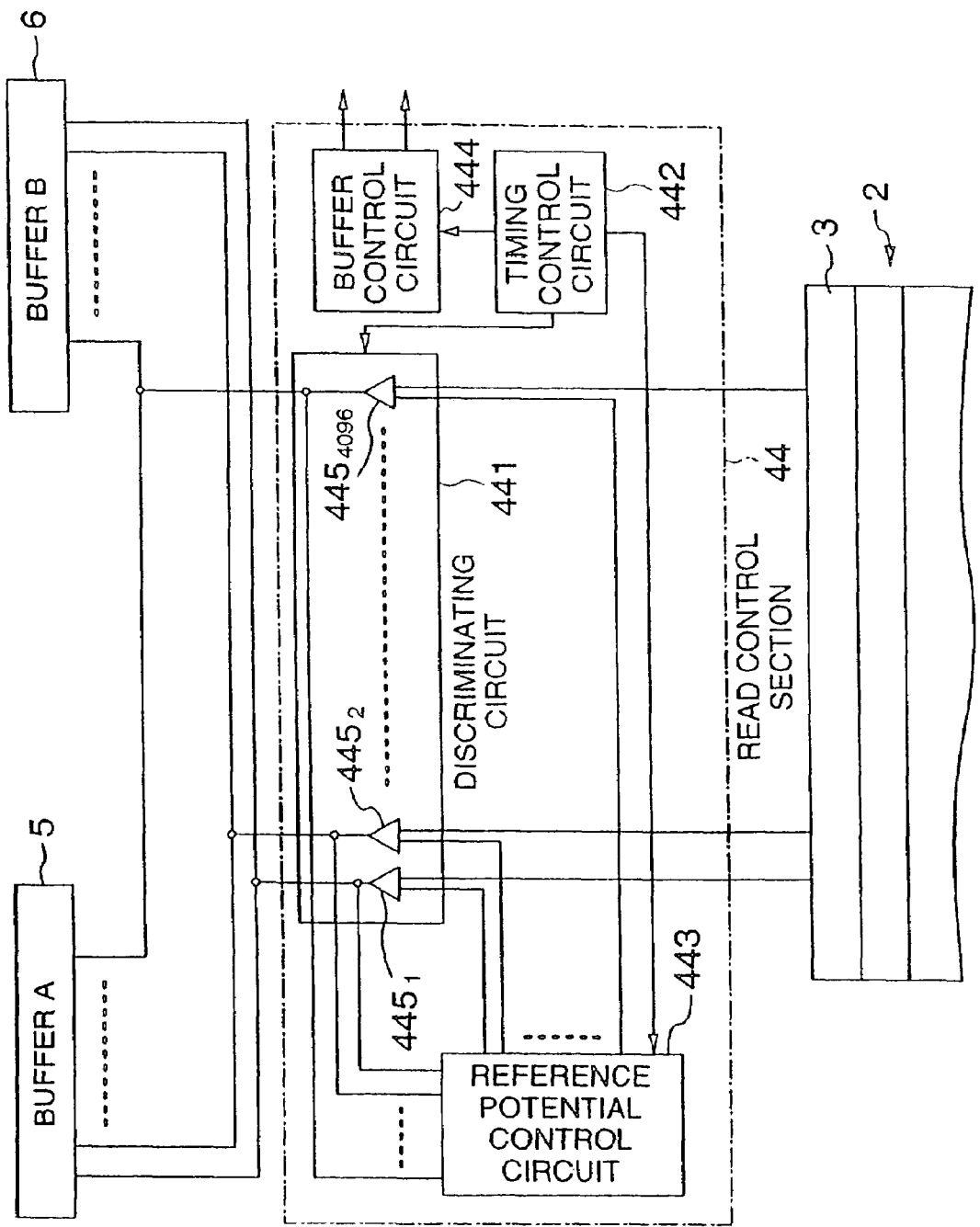
FIG. 3 is a schematic diagram showing a configuration of a read control section 44.

FIG. 3 is a schematic diagram showing a configuration of the read control section 44.

As shown in FIG. 3, the read control section 44 comprises a discriminating circuit 441, a timing control circuit 442, a reference potential control circuit 443 and a buffer control circuit 444.

The discriminating circuit 441 has discriminators $445_1$ to $445_{4096}$ that respectively correspond to the cells in each memory block 3. The discriminating circuit 441 sequentially discriminates one data block from two data blocks stored in the memory block 3 using the discriminators $445_1$ to $445_{4096}$.

The reference potential control circuit 443 sets a reference potential (discriminating threshold) of each of the discriminators $445_1$ to $445_{4096}$ arranged in the discriminating circuit 441.

The buffer control circuit 444 controls the data block buffers A5 and B6 to specify the destination for storing the data block discriminated by the discriminating circuit 441.

The timing control circuit 442 controls the operation timings of the various parts of the read control section 44.

The thus configured read control circuit 44 reads data in the following procedure.

Potential levels to be set to the cells in a to-be-read memory block 3 are fed to the corresponding discriminators $445_1$ to $445_{4096}$, respectively.

Concurrently with this operation, the reference potential control circuit 443 sets a reference potential to each of the discriminators $445_1$ to $445_{4096}$. That is, the reference potential to be set is an intermediate level between a potential level corresponding to a minimum level that can be indicated by a two-bit data string when the value set to the first bit of the two-bit data string is "1" and that set to the second bit is unknown and a potential level corresponding to a maximum level that can be indicated by the two-bit data string when the value set to the first bit is "0" and that set to the second bit is unknown.

As a result, the discriminating circuit 441 reads the data block stored in the data block buffer A5 from the two data blocks stored in the memory block 3 (the two data blocks being the data block stored in the buffer A5 and the data block stored in the buffer B6).

The buffer control circuit 444 controls the data block read from the memory block 3 so that the read data block is stored in the data block buffer A5.

Then, the reference potential control circuit 443 sets a reference potential for each of the discriminators $445_1$ to $445_{4096}$. That is, the reference potential to be set to a discriminator is an intermediate level between a potential level corresponding to a minimum level that can be indicated by a two-bit data string when the value set to the first bit of the two-bit data string is the value discriminated by the discriminator through the aforementioned operation and that set to the second bit is "1" and a potential level corresponding to a maximum level that can be indicated by the two-bit data string when the value set to the first bit is the value discriminated by the discriminator through the aforementioned operation and that set to the second bit is "0."

As a result, the discriminating circuit 441 reads the data block stored in the data block buffer B6 from the two data blocks stored in the memory block 3 (the data block stored in the buffer A5 and the data block stored in the buffer B6).

The buffer control circuit 444 controls the data block read from the memory block 3 so that the read data block is stored in the data block buffer B6.

The two data blocks stored in the memory block 3 are read in the order of the data block buffer A5 and the data block buffer B6 in this way.

The read operation will be described in more detail.

Figure 4:
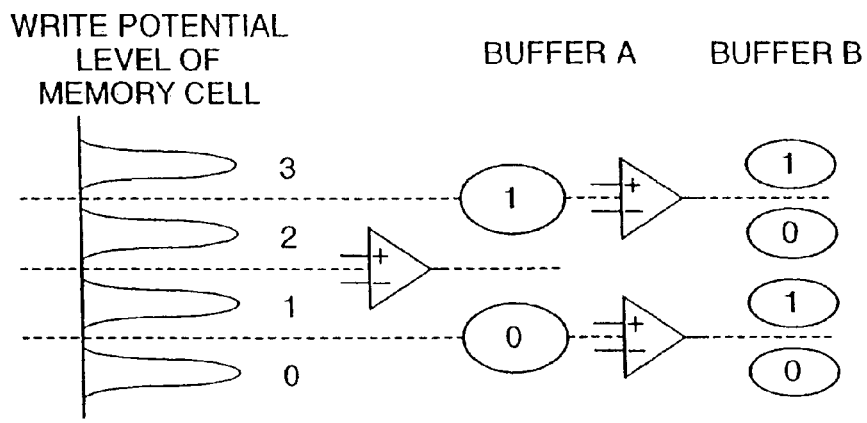
FIG. 4 is a diagram explaining a data discriminating process to be performed when two pieces of bit data are read from the potential level of a floating gate of a cell in a memory block 3 and the read pieces of data are stored in the data block buffers 5 and 6.

FIG. 4 is a diagram explaining a data discriminating process to be performed when two pieces of one-bit data are read from the potential level of the floating gate of a cell in a memory block 3 and the read pieces of data are stored in the data block buffers A5 and B6, respectively.

In a manner similar to the case shown in FIG. 2, the potential of the floating gate is set to and held at one of the four distributions in the cell.

The thus set and held potential is discriminated using a discriminator corresponding to the cell in such a manner that the potential belongs to either one of two groups: a group having levels "3" and "2," and a group having levels "1" and "0." If the set and held potential belongs to the former group, "1" is stored in the data block buffer A5 having a bit number corresponding to the cell. If the set and held potential belongs to the latter group, "0" is stored in the buffer A5 having the bit number corresponding to the cell.

That is, data to be stored in the data block buffer A5 can be read through only one discriminating operation.

Further, data to be stored in the data block buffer B6 can be read through another discriminating operation.

For example, if it is found out through the first discriminating operation that the set and held potential belongs to level "3" or "2," another discriminating operation is performed to find out which level the potential is actually set to, either level "3" or "2." If the potential is found out to be set to level "3," "1" is stored to the data block buffer B6 having a bit number corresponding to the cell, whereas if the potential is found out to be set to level "2," "0" is stored in the buffer B6 having the bit number corresponding to the cell.

Further, if it is found out through the first discriminating operation that the set and held potential belongs to level "1" or "0," another discriminating operation is performed to find out which level the potential is actually set to, either level "1" or "0." If the potential is found out to be set to level "1," "1" is stored to the data block buffer B6 having a bit number corresponding to the cell, whereas if the potential is found out to be set to level "0," "0" is stored in the buffer B6 having the bit number corresponding to the cell.

As described above, this embodiment allows two data blocks stored in a memory block 3 can be sequentially read every time the discriminating circuit 441 performs the discriminating operation.

Therefore, multilevel memory technology can be achieved without impairing data reading performance nor increasing chip area due to the increased number of discriminators.

If the two data blocks stored in a single memory block 3 are two-sector data belonging to a single file, the two-sector data are read from the memory block 3 in the same order as they are written.

In this case, it may be so arranged at the time the two-sector data are written to the memory block 3 that the I/O control circuit 7 stores the preceding portion of the two-sector data in the data block buffer A5 and the succeeding portion in the data block buffer B6.

Such arrangement allows the two-sector data written in the memory block 3 to be read in the correct order.

On the other hand, the two data blocks stored in a single memory block 3 are two-sector data respectively belonging to different files, the two-sector data may be accessed totally independently in some cases.

In such cases, if one portion of the two-sector data temporarily stored in the data block buffer A5 is requested to be read at the time the two-sector data are written to the memory block 3, such requested portion of the two-sector data can be read by causing the discriminating circuit 441 to perform the discriminating operation once.

If, on the other hand, the other portion of the two-sector data temporarily stored in the data block buffer B6 is requested to be read at the time the two-sector data are written to the memory block 3, such requested portion of the two-sector data can be read by causing the discriminating circuit 441 to perform the discriminating operation twice.

However, if no data is yet written to the memory block 3 from the data block buffer A5, the potential of the corresponding cell in the memory block 3 is set to a level corresponding to level "3" or "2" as described above. Therefore, the requested portion of the two-sector data temporarily stored in the buffer B6 can be read through only one discriminating operation.

Hence, not only data in the data block buffer A5 can be read from the memory block 3 if no data is written to the memory block from the data block buffer B6, but also data in the data block buffer B6 can be read from the memory block 3 if no data is written to the memory block 3 from the data block buffer A5.

The example in which data is written to a cell by reducing the potential level of the cell while charging electrons to the floating gate of the cell that is in the complete "erase" state has been described in the first embodiment. However, the present invention is not limited to this example.

It should be reminded that the potential level of a cell, whether it is high or low, in the erase state or in the write state differs from one memory to another. For example, some define "erase" as charging electrons to the floating gate of a cell that is in the complete write state, and others define the "erase" state as setting the potential level to "0" and the "write" state as setting the potential level to "1" or more. Amid such variations in the definition of the "erase" and "write" states, the present invention can take care of any of these cases by altering the set potential to an appropriate level.

Further., while the example in which the storage capacity of each memory block 3 in the EEPROM array 2 is 1024 bytes (=8192 bits) has been described in the aforementioned embodiment, the present invention is not limited to this example.

Still further, it is beneficial in the aforementioned embodiment to append to each memory block 3 an information area that stores management information of that block in order to efficiently manage stored data.

Figure 5:
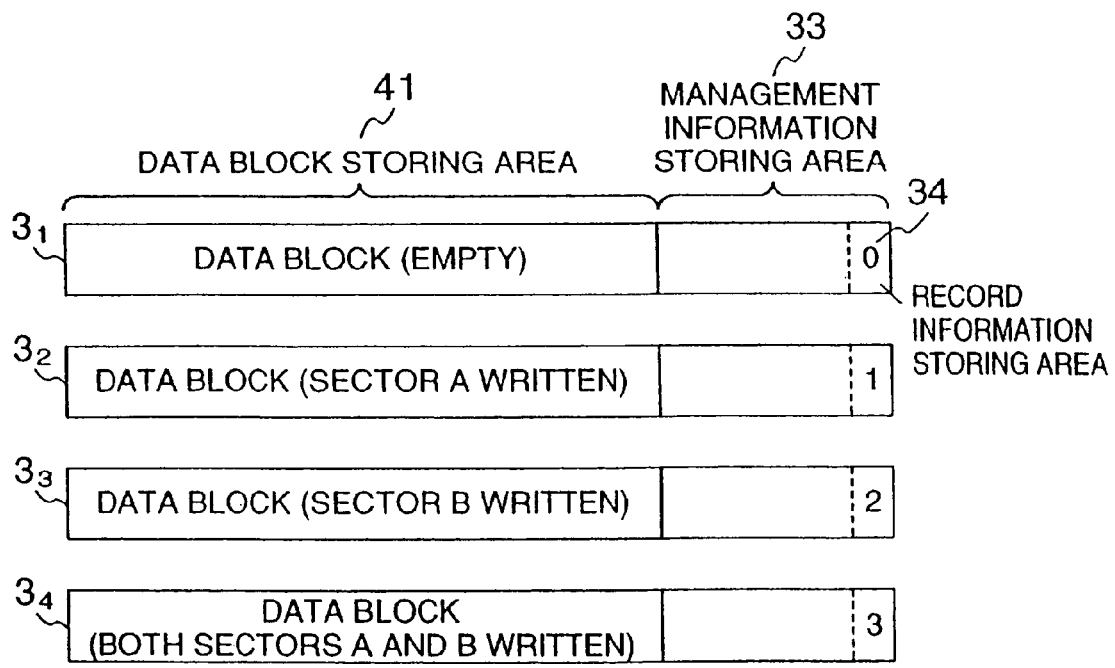
FIG. 5 is a diagram explaining a modification of the embodiment shown in FIG. 1 in which an information area for storing management information is appended to each of memory blocks.

FIG. 5 is a diagram explaining a modification of the first embodiment, in which an information area is appended to each memory block in order to store management information of that block.

Memory blocks $3_1$ to $3_4$, which are exemplary modifications of the memory blocks 3 shown in FIG. 1, have information areas for storing management information.

Each of the memory blocks $3_1$ to $3_4$ comprises a data block storing area 41 and a management information storing area 33. The data block storing area 41 stores two data blocks (a data block temporarily stored in the data block buffer A5 and a data block stored in the data block buffer B6 shown in FIG. 1). The management information storing area 33 stores management information of the data block storing area 41 such as storing logic addresses, rewriting time information, stored data identification information, and error detecting and correcting codes.

The example shown in FIG. 5 presents the data block storing area 41 of the memory block $3_1$ with nothing written therein, the data block storing area 41 of the memory block $3_2$ with a data block of the data block buffer A5 written therein, the data block storing area 41 of the memory block $3_3$ with a data block of the data block buffer B6 written therein, and the data block storing area 41 of the memory block $3_4$ with the data blocks of the data block buffers A5 and B6 written therein.

The management information storing area 33 includes a record information storing area 34 that stores storing record information as part of the management information.

In this example, it is designed to write "0" in the record information storing area 34 if nothing is stored in the data block storing area 41, "1" in the record information storing area 34 if the data block of the data block buffer A5 is written in the data block storing area 41, "2" in the record information storing area 34 if the data block of the data block buffer B6 is written in the data block storing area 41, and "3" in the record information storing area 34 if the data blocks of the data block buffers A5 and B6 are written in the data block storing area 41.

By the way, if "1" is written in the record information storing area 34, it means that the potential of each cell constituting the data block storing area 41 is set to a level corresponding to level "3" or "2," or level "1" or "0" shown in FIG. 2.

Further, if "2" is written in the record information storing area 34, it means that the potential of each cell constituting the data block storing area 41 is set to a level corresponding to level "3" or "2" shown in FIG. 2.

Still further, if "3" is written in the record information storing area 34, it means that the potential of each cell constituting the data block storing area 41 can be set to any level corresponding to level "3," "2," "1" or "0" shown in FIG. 2.

Therefore, by checking the value stored in the record information storing area 34, the operator can grasp the potential level that is set to each cell constituting a data block storing area 41. Hence, the operator can determine how data should be read.

Figure 6:
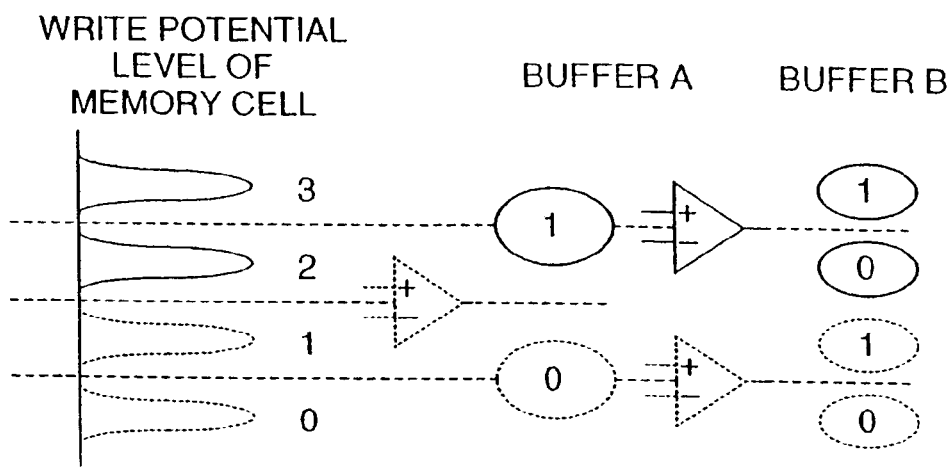
FIG. 6 is a diagram explaining how a discriminating operation is performed using a value stored in a record storing area 34 shown in FIG. 5.

FIG. 6 is a diagram showing an exemplary application of the record information storing area 34 and explaining the flow of steps to be taken in executing a discriminating process using a value stored in the record information storing area 34.

The following describes a case where "2" is stored in the record information storing area 34.

As described above, when "2" is stored in the record information storing area 34, the potential to be possibly set to each cell constituting the data block storing area 41 is level "3" or "2" (the levels indicated by the solid lines in FIG. 6).

Therefore, the discriminating operation is required to be performed only for those distributions indicated by the solid lines. That is, only one discriminating operation is required to be performed.

In order to switch the discriminating operation based on a value stored in a record information storing area as described above using the memory chip according to this embodiment, the following circuit configuration may be employed.

The discriminating circuit 441 is provided with means for discriminating the potential of a cell constituting the record information storing area 34 before discriminating the potential of each cell constituting the data block storing area 41.

In order to keep the reference potential constant at the time of discriminating operation, it should be so designed that the cell constituting a record information storing area 34 can store one bit (two levels). Therefore, if four levels are to be stored in a record information storing area 34 as described above, a record information storing area 34 consists of two cells.

In setting the reference potential, the reference potential control circuit 443 is caused to take into account the result of the discriminating operation performed to the record information storing area 34 by the discriminating circuit 441 before the discriminating operation is performed to the corresponding data block storing area 41.

That is, when "2" is stored in a record information storing area 34, the reference potential is set to an intermediate level between levels "3" and "2" shown in FIG. 6.

Further, when "1" is stored in a record information storing area 34, the reference potential is set to an intermediate level between levels. "2" and "1" shown in FIG. 6.

When "3" is stored in a record information storing area 34, the reference potential is set according to the procedure described with reference to the first embodiment of the present invention.

Record information can be written by causing the write control section 42 to check the source of a data block, i.e., to check which data block buffer such data block is sent from and to refer to the record information of the destination of such data block, i.e., to refer to the record information of a memory block to which such data block is to be written when such data block is written to a data block storing area 41.

The reference potential at the time of discriminating operation may be switched on the basis of an externally applied identifier such as a command code instead of arranging an area for storing record information in a memory block.

While the examples in which four levels (two bits) are stored in each cell have been described in the aforementioned embodiments, the present invention is not limited to these examples. Also acceptable are examples in which eight levels (three bits), sixteen levels (four bits) or levels greater than these are stored in each cell.

Before concluding the specification, an information storage device using the memory chip according to the aforementioned embodiments will be described.

Figure 7:
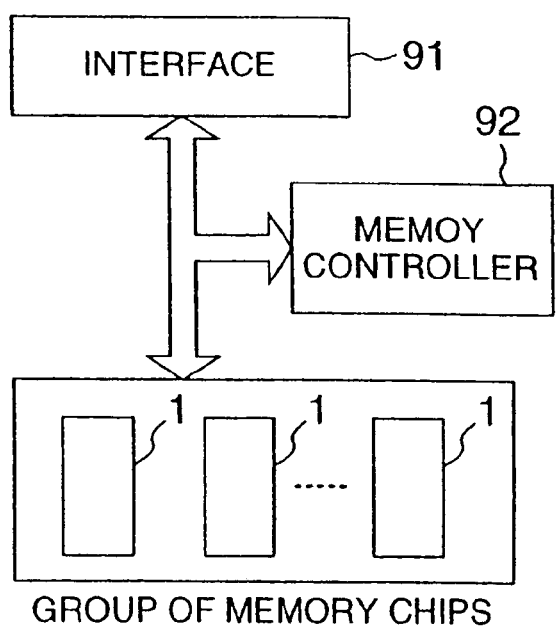
FIG. 7 is a schematic diagram showing a configuration of an information storage device using the memory chip shown in FIG. 1.

FIG. 7 is a schematic diagram showing a configuration of an information storage device using the memory chip shown in FIG. 1.

The information storage device comprises an interface 91 for communicating with a host computer and a memory chip controller 92 for controlling a plurality of memory chips 1. The interface 91 and the memory chip controller 92 may be those commonly used for conventional information storage devices.

As described in the foregoing, according to the embodiments of the present invention, a plurality of pieces of one-bit data stored in a cell can be read on a one-bit data basis every time the discriminating means dedicated to the cell performs a discriminating operation.

Therefore, the present invention can achieve multilevel memory technology without impairing data reading performance nor increasing chip area due to an increased number of discriminating means.

What we claim is:

1. For an electrically programmable non-volatile multi-level memory device including a plurality of non-volatile multi-level memory cells, each of the multi-level memory cells having a non-volatile memory storage portion for determining an electrically alterable voltage threshold value, electrons being capable of being injected into the non-volatile memory storage portion,
   a method of operating the electrically alterable non-volatile multi-level memory device, comprising:
   determining a status of at least one non-volatile multi-level memory cell of the plurality of non-volatile multi-level memory cells to a plurality of states including at least a first level state of an erased state, a second level state, a third level state and a fourth level state of a plurality of programmed states, a level distance to the fourth level state from the first level state being larger than that to the third level state from the first level state and a level distance to the third level state from the first level state being larger than that to the second level state from the first level state, and
   controlling an electrically alterable voltage threshold value of at least one non-volatile multi-level memory cell to a value which responds to a higher bit and a lower bit of digital data to be stored in the least one non-volatile multi-level memory cell,
   wherein the higher bit of the digital data to be stored in the at least one non-volatile multi-level memory cell is digital data of one block data and the lower bit of the digital data to be stored in the least one non-volatile multi-level memory cell is digital data of another block data,
   and wherein the one block data and the other one block data are sent from an exterior of the electrically alterable non-volatile multi-level memory device in different timings.

2. The method of operating the electrically alterable non-volatile multi-level memory according to claim 1, further comprising:
   temporarily storing the higher bit and the lower bit of the data to be stored in the least one non-volatile multi-level memory cell into buffers before the higher bit and the lower bit of the data will be finally stored in the at least one non-volatile multi-level memory cell.

3. The method of operating the electrically alterable non-volatile multi-level memory according to claim 1,
   wherein each of the one block data and the other one block data is a sector memory having a capacity which includes 512 bytes.

4. The method of operating the electrically alterable non-volatile multi-level memory according to claim 2,
   wherein each of the one block data and the other one block data is a sector memory having a capacity which includes 512 bytes.

* * * * *